United States Patent
Yu et al.

(10) Patent No.: US 6,943,091 B2
(45) Date of Patent: Sep. 13, 2005

(54) SEQUENTIAL DEPOSITION PROCESS FOR GAP FILLING

(75) Inventors: Hung-Tien Yu, I-Lan (TW); Yiwen Chen, Hsin-Chu (TW)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 09/905,053

(22) Filed: Jul. 12, 2001

(65) Prior Publication Data

US 2002/0052128 A1 May 2, 2002

(30) Foreign Application Priority Data

Oct. 31, 2000 (TW) ........................................ 89122933 A

(51) Int. Cl.$^7$ .............................. H01L 21/76; G03F 7/26
(52) U.S. Cl. ........................................ 438/424; 430/313
(58) Field of Search .............................. 438/424, 778, 438/784, 787, 788, 792

(56) References Cited

U.S. PATENT DOCUMENTS

| | | | |
|---|---|---|---|
| 4,732,761 A | 3/1988 | Machida et al. | ....... 204/192.32 |
| 4,962,063 A | 10/1990 | Maydan et al. | ............. 457/228 |
| 5,089,442 A | 2/1992 | Olmer | ..................... 204/192.3 |
| 5,124,014 A | 6/1992 | Foo et al. | ............... 204/192.32 |
| 5,204,288 A | 4/1993 | Marks et al. | ................ 437/228 |
| 5,244,841 A | 9/1993 | Marks et al. | ................ 437/228 |
| 5,356,722 A | 10/1994 | Nguyen et al. | |
| 5,710,079 A | 1/1998 | Sukharev | |
| 5,807,785 A | 9/1998 | Ravi | |
| 5,965,203 A | 10/1999 | Gabric et al. | |
| 6,106,678 A * | 8/2000 | Shufflebotham et al. | ..................... 204/192.32 |
| 6,149,987 A | 11/2000 | Perng et al. | |
| 6,194,038 B1 | 2/2001 | Rossman | |
| 6,218,268 B1 | 4/2001 | Xia et al. | |
| 6,236,105 B1 | 5/2001 | Kariya | |
| 6,331,494 B1 * | 12/2001 | Olson et al. | ................ 438/770 |
| 6,340,435 B1 | 1/2002 | Bjorkman et al. | |
| 6,348,421 B1 | 2/2002 | Shu et al. | |
| 6,489,254 B1 * | 12/2002 | Kelkar et al. | ................ 438/778 |
| 6,527,910 B2 | 3/2003 | Rossman | |
| 6,733,955 B1 * | 5/2004 | Geiger et al. | ................ 430/313 |
| 2002/0000195 A1 | 1/2002 | Bang et al. | |

FOREIGN PATENT DOCUMENTS

EP 0520519 12/1992

OTHER PUBLICATIONS

Fujino et al., "Dependence of Deposition Characteristics on Base Materials in TEOS and Ozone CVD at Atmospheric Pressure," *J. Electrochem. Soc.*, 138(2):550–554 (1991).

Kwok et al., "Surface Related Phenomena in Integrated PECVD/Ozone–TEOS SACVD Processes for Sub–Half Micron Gap Fill: Electrostatic Effects," *J. Electrochem. Soc.*, 141(8):2172–2177 (1994).

Kuo, Y., "Etch Mechanism in the Low Refractive Index Silicon Nitride Plasma–enhanced Chemical Vapor Deposition Process." *Applied Physics Letters*. 63(2): 144–146 (1993).

Machida. K., et al., "SiO, Planarization Technology with biasings and Electron Cyclotron Resonance Deposition for Submicron Interconnections." *J. Vac. Sci. Technol. B*. 4(4): 818–821 91986).

Li, J., "Modeling Studies of the Mechanisms in Biased ECR CVD".

Lassig. S., et al., "Intermetal Dielectric Deposition by Electron Cyclotron Resonance Chemical Vapor Deposition (ECR CVD). "pp. 1–21.

* cited by examiner

Primary Examiner—Hsien-Ming Lee
(74) Attorney, Agent, or Firm—Townsend & Townsend & Crew

(57) ABSTRACT

A deposition method for filling recesses in a substrate is described. In the method, the substrate is exposed to an energized deposition gas comprising first and second components, to deposit a first layer of a material in the recess, and thereafter, the ratio of the first component to the second component is reduced, to deposit a second layer of the material over the first layer in the recess. The deposition method may be used to fill recesses in a substrate and smoothen out reentrant cavities in a silicon nitride liner, in the fabrication of polysilicon gates in a substrate.

21 Claims, 3 Drawing Sheets

SEQUENTIAL DEPOSITION PROCESS FOR GAP FILLING

BACKGROUND

Embodiments of the present invention relate to a deposition process for filling recesses in a substrate.

Electronic circuitry, such as integrated circuits, is formed by the deposition, formation (such as by oxidation, nitridation, etc.) and partial removal of layers on a substrate. The substrate may be a silicon wafer (although other materials such as gallium arsenide or glass can be used) onto which various layers may be deposited, removed, or partially removed. A substrate can be a single material but is more often a base material having situated thereon one more conducting, insulating (dielectric) or semiconducting materials.

The partial removal of a material on a substrate via reactive gases, commonly known as etching, begins with a step in which a patterned photoresist or mask layer is formed on the substrate by a conventional photolithographic method. In the following etching step, the substrate is placed in a chamber and exposed to an energized plasma of a gas that is energized by, for example, microwave energy or radio frequency energy. A biasing electrical voltage may be coupled to the energized gas so that charged species (reactive ions) within the gas are energized toward the substrate. In the etching method, recesses shaped as narrow channels, holes, or trenches, are formed in the substrate.

After etching, deposition methods are used to fill the etched recesses, for example, with a dielectric or conducting material. However, in some conventional recess-filling methods, voids are often formed within the material being deposited in the recess during the recess-filling process. The voids are especially prone to being formed when the sidewalls of the recesses are not smooth which arise from the narrow widths of the recesses. In the deposition process, overhangs that form on the non-smooth recess sidewalls often coalesce to form a void in the recess.

In a "bottom-up" deposition method, the recesses are attempted to be filled without voids, by maintaining a higher deposition rate at the bottom of the recess relative to the deposition rate on the sidewalls of the recesses. For example, when silicon oxide is deposited in a recess, the deposition rate of the silicon oxide on underlying silicon material is higher than the deposition rate of the silicon oxide on underlying silicon nitride material, as for example, shown in FIG. 2. The higher oxide deposition rates on silicon reduce the formation of overhangs during filling of the recess, especially when the silicon material is at the bottom of the recess and the nitride material is on the sidewalls of the recess. For example, the bottom-up deposition method is often applied in shallow trench isolation processes. In such methods, a precursor deposition gas, such as a combination of $O_3$ (ozone) and TEOS (tetraethylorthosilicate) having a high ratio of $O_3$ to TEOS is used to enhance the selectivity of the deposition growth rates for both nitride and thermal oxide. The higher the ratio of $O_3$ to TEOS the higher is the deposition rate selectivity ratio, which in turn, affects the recess-filling capability.

However, when the bottom-up method is used to fill recesses 27 in a substrate 20, some recesses 27 are easily filled but others are not, even when the recesses 27 are not very narrow, as for example, illustrated in FIG. 1. In this substrate 20, a plurality of recesses 27, such as trenches, are etched between polysilicon gates 22 on the substrate 20. The sidewalls of the polysilicon gates 22 are covered with nitride spacers 24. A conformal nitride liner 26 covers the nitride spacers 24, polysilicon gates 22, and other portions of the substrate, such as the bottom of the recesses 27. After an oxide layer 28 is formed to fill the recesses 27, some of the recesses 27 are not easily filled, and voids 30 are still formed in these recesses 27.

Generally, the recesses 27 which are not easily filled without forming voids 30 are those which have non-smooth profiles with some reentrant cavities 10 thereon, as shown in FIG. 3. To find a method for filling these recesses 27, precursor gas compositions having different $O_3$ concentrations, and different process temperatures were tried. Although using different process parameters was determined to improve recess filling a little, the voids 30 were still formed in some of the recesses 27 because of their non-smooth profiles. For example, voids 30 were formed even in the small tapered recesses 27 when the sidewalls of the tapered recesses 27 had the reentrant cavities 10.

Thus, it is desirable to have a deposition method that is capable of filling recesses, such as trenches, in a substrate, without forming voids in the recesses.

SUMMARY

A deposition method for filling recesses in a substrate comprises exposing the substrate to an energized deposition gas comprising first and second components, to deposit a first layer of a material in the recess, and thereafter, reducing the ratio of the first component to the second component, to deposit a second layer of the material over the first layer in the recess.

Another deposition method for filling recesses in a substrate, comprises providing a substrate having recesses; exposing the substrate to an energized deposition gas comprising a first volumetric flow ratio of $O_3$ and TEOS, to deposit a first layer of silicon oxide material in the recess; and reducing the volumetric flow ratio of the $O_3$ to the TEOS, to deposit a second layer of silicon oxide material over the first layer in the recess.

The deposition method may be used to fill recesses on a substrate that are between polysilicon gates and have sidewalls covered with silicon nitride spacers. The silicon nitride spacers, polysilicon gates and the other portions of the substrate, are covered with a silicon nitride liner. The method comprises providing an energized deposition gas comprising $O_3$ and TEOS, to form a first layer of silicon oxide in the recess; and reducing the volumetric flow ratio of $O_3$ to the TEOS in the deposition gas, to fill the recesses with silicon oxide after the first layer is formed.

DRAWINGS

DESCRIPTION

Figure 1:
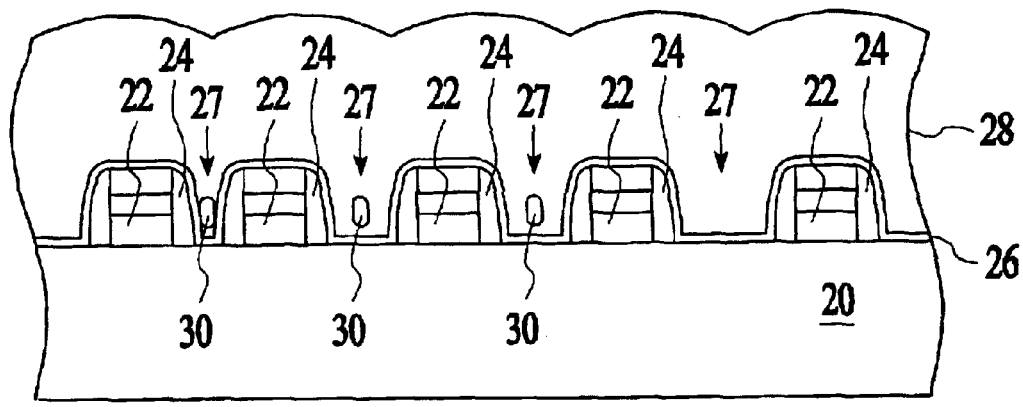
FIG. 1 (prior art) is a schematic cross-sectional view of a substrate having recesses filled by a conventional recess-filling method.
Figure 2:
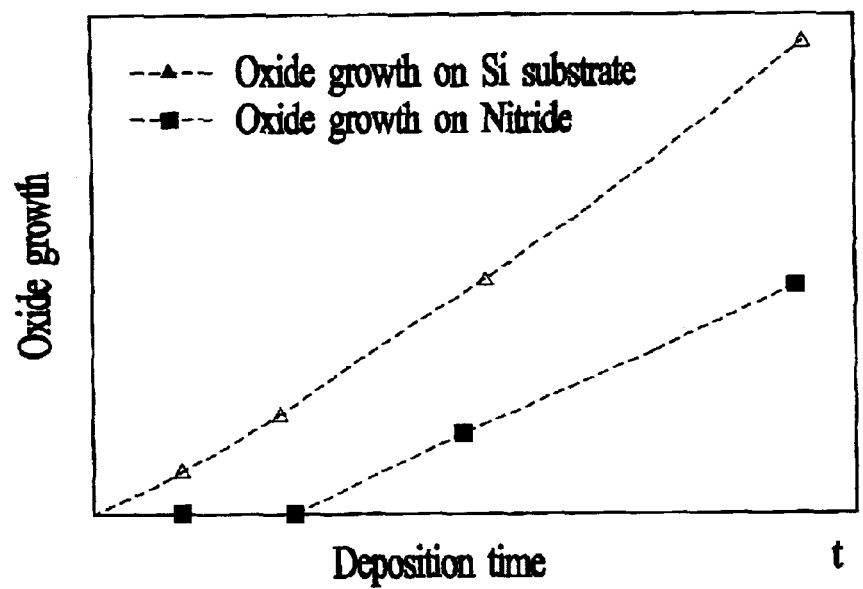
FIG. 2 (prior art) is a graph showing a comparison of the deposition rates of silicon oxide material on underlying silicon or silicon nitride.
Figure 3:
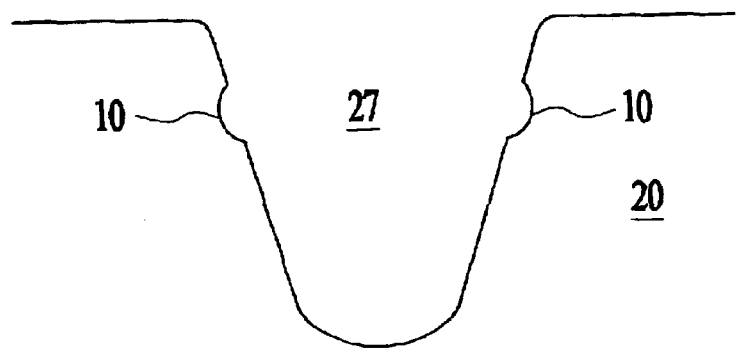
FIG. 3 (prior art) is a schematic cross-sectional view of a profile of a recess having reentrant cavities.
Figure 4A:
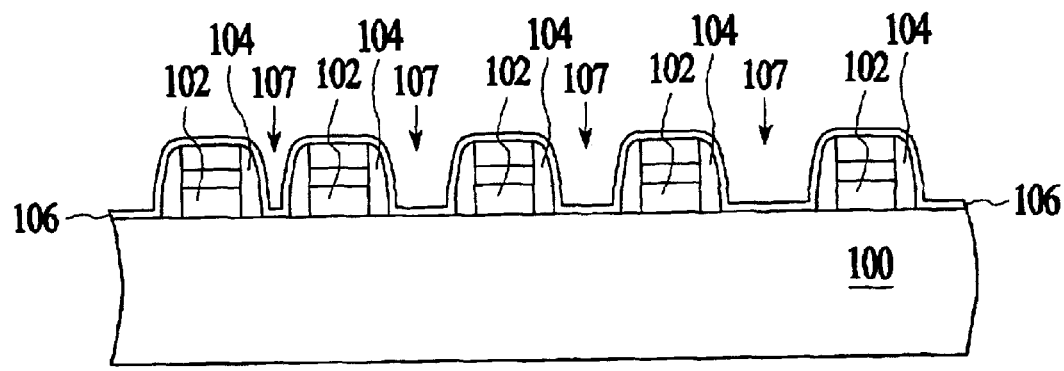
FIGS. 4A to 4C are schematic cross-sectional views of a substrate having recesses that are filled by deposition method according to an embodiment of the present invention.
Figure 4B:
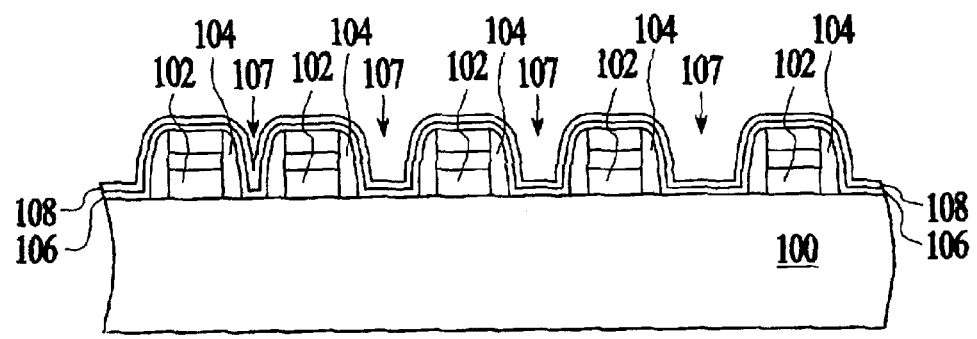
Figure 4C:
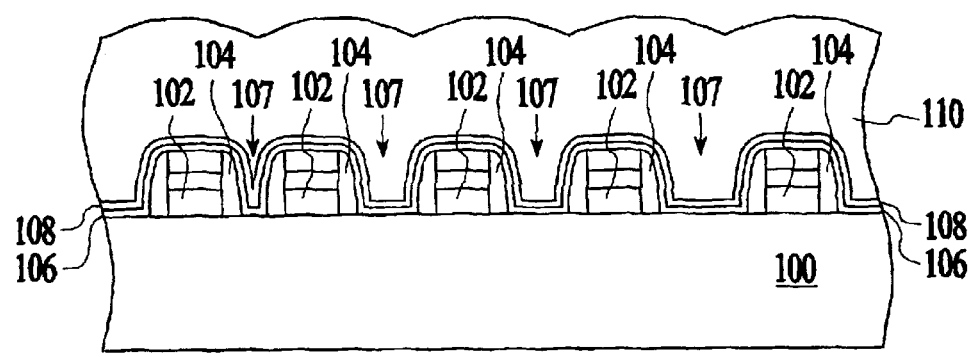

An exemplary embodiment of an application of a deposition method according to the present invention, to fill recesses 107 in a substrate 100, is illustrated in FIGS. 4A to 4C. While the present method is illustrated with respect to an exemplary substrate embodiment, it should be noted that the method may be used on other types of substrates 100, as would be apparent to one of ordinary skill in the art. Referring to FIG. 4A, an exemplary substrate embodiment, has a plurality of polysilicon gates 102 formed in the substrate 100 and the sidewall portions of the polysilicon gates 102 are covered with silicon nitride spacers 104. A liner 106 comprising a thin layer of silicon nitride material is formed substantially conformal to and on the nitride spacers 104, polysilicon gates 102, and other portions of the substrate 100. Note that the liner 106 often has reentrant cavities thereon (as for example illustrated in FIG. 3). The recesses 107 are generally between the polysilicon gates 102.

Referring to FIG. 4B, in a first stage, a first layer 108 is deposited in the recesses 27 and over the substrate 100. In this stage, a deposition gas composition that provides different deposition rates depending upon the underlying material upon which the deposition occurs, is used. In one version, the deposition gas comprises an oxygen-containing compound, such as one or more of $O_3$ or TEOS. A suitable deposition gas composition comprises first and second components, such as $O_3$ and TEOS, in a volumetric flow ratio that provides different deposition rates on silicon or silicon nitride material. The deposition gas, when energized to form a plasma, deposits a first layer 108 of silicon oxide on the liner 106. The first layer 108 is formed using the bottom-up growth mechanism for smoothening the profile of the recesses 107 by filling any reentrant cavities. However, The recesses 107 are not entirely filled in this step and other sequential deposition steps may be used to fill the recesses 107.

The reentrant cavities in the liner 106 are smoothened out because the deposition gas of $O_3$ and TEOS provides higher deposition rates of oxide material on the sidewall portions of the recesses 27 than on the bottom portions. As shown in FIG. 4A, the thickness of silicon nitride material on the sidewalls of the recesses 107 (the oxide spacers 104 plus the nitride liner 106) is substantially thicker than the thickness of the silicon nitride material on the bottoms of the recesses 107 (only the nitride liner 106). Therefore, in the beginning, the reentrant cavities of the nitride liner 106 on the sidewalls of the recesses are gradually smoothened out by the deposition of the first oxide layer 108. Typically, a thickness of the first oxide layer 108 that is suitable for smoothening the reentrant cavities in the nitride liner 106 is from about 200 to about 800 angstroms.

Referring to FIG. 4C, after deposition of the first layer 108, the process conditions are changed in a second process stage to deposit a second layer 110, also of silicon oxide material, to fill the recesses 107. In the second stage, deposition of the oxide material is continued, but the ratio of $O_3$ to TEOS in the deposition gas is gradually reduced, to deposit additional oxide material in a second layer 110 that fills the recesses 107. Note that the overall deposition rate of a deposition gas having a high ratio of $O_3$:TEOS is quite slow, and therefore, the ratio of $O_3$ to TEOS is gradually reduced in the second stage to also increase the deposition rate. In the ratio-reducing step, the oxide deposition rate on the sidewalls of each recess 107 gradually matches up to the deposition rate obtained on the bottom of the recesses 107. The ratio-reducing step is typically performed for about 30 seconds after the reentrant cavities have been smoothened out.

The recesses 107 may also be filled by performing a first stage that uses a deposition gas having a high ratio of $O_3$:TEOS followed by a second stage that uses a deposition gas having a low ratio of $O_3$:TEOS. However, this method may not be as desirable because the profiles of the recesses 107 that were filled using such first and second stages were generally too small to be fully filled in the second stage, and thus, some voids were formed in the recesses 107 during the second stage. The recesses were narrower for the second stage because they are partially filled with the oxide material deposited formed in the first stage. Such a two-stage method is often better performed by re-initializing the chamber after the first stage, for example, by re-introducing a deposition gas comprising $O_3$ and TEOS into the chamber.

While the composition of the deposition gas may be changed gradually or in a step-wise manner; it is generally preferred to continuously introduce the deposition gas into the chamber while gradually changing the composition of the deposition gas, for example, by reducing the ratio of $O_3$ to TEOS in the deposition gas while it is flowing into the chamber. The reduction may be done by, for example, reducing the flow rate of $O_3$ or increasing the flow rate of TEOS. A gradual change in deposition conditions reduces the formation of interfaces between abutting oxide layers within the deposited oxide material that may otherwise form when a step-wise method having distinct stages is used. Such interfaces are undesirable because they are often a source of voids. The interfaces are clearly visible under a microscope after a specimen is dipped in an acid bath. An acid dip may also be performed to verify the quality of the recess filling process.

As shown in FIG. 4, the recesses 107 filled by the present method have substantially no voids therein. Moreover, the narrowest recess 107 which can be filled by the present invention, as for example, illustrated in the leftmost recess of FIG. 4C, has a width of about 0.08 micrometers. Furthermore, according to the present invention, the recesses having different widths can be simultaneously filled.

It is noted that the invention has been described in detail herein with reference to recesses between polysilicon gates in a substrate comprising a silicon semiconductor wafer; however, it is to be understood that this description is by way of example only, and is not to be construed to limit the present invention. For example, a method according to the present invention may also be used to fill recesses for shallow trench isolation, without departing from the spirit and scope of the present invention. Thus, although the invention has been described in detail herein with reference to its preferred embodiment, it is to be understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and scope of the invention as claimed below.

What is claimed is:

1. A deposition method capable of filling recesses in a substrate, the method comprising:
   (a) providing a substrate having recesses defining side walls and recess bottoms;
   (b) exposing the substrate to an energized deposition gas comprising a first component comprising ozone and a second component, to deposit a first layer of a material in the recess at different rates over the side walls and recess bottoms; and
   (c) reducing the ratio of the first component to the second component, to deposit a second layer of the material over the first layer in the recess;

wherein the ratio-reducing step is performed by reducing the flow rate of $O_3$, and wherein the ratio-reducing step is performed for about 30 seconds.

2. A method according to claim 1 wherein the second component comprises TEOS.

3. A deposition method capable of filling recesses in a substrate, the method comprising:
   (a) providing a substrate having recesses defining side walls and recess bottoms, the substrate having recesses between polysilicon gates;
   (b) exposing the substrate to an energized deposition gas comprising a first component comprising ozone and a second component, to deposit a first layer of a material in the recess at different rates over the side walls and recess bottoms; and
   (c) reducing the ratio of the first component to the second component, to deposit a second layer of the material over the first layer in the recess.

4. A method according to claim 3, wherein the recesses have sidewall portions covered with silicon nitride spacers, and wherein the silicon nitride spacers, the polysilicon gates and the other portions of the substrate, are covered with a silicon nitride liner.

5. A deposition method capable of filling recesses in a substrate, the method comprising:
   (a) providing a substrate having recesses defining side walls and recess bottoms;
   (b) exposing the substrate to an energized deposition gas comprising a first component comprising ozone and a second component, to deposit a first layer of a material in the recess at different rates over the side walls and recess bottoms, wherein the first layer has a thickness of from about 200 to about 800 angstroms; and
   (c) reducing the ratio of the first component to the second component, to deposit a second layer of the material over the first layer in the recess.

6. A deposition method capable of filling recesses in a substrate, the method comprising:
   (a) providing a substrate having recesses defining side walls and recess bottoms;
   (b) exposing the substrate to an energized deposition gas comprising a first volumetric flow ratio of $O_3$ and TEOS, to deposit a first layer of silicon oxide in the recess at different rates over the side walls and recess bottoms; and
   (c) reducing the volumetric flow ratio of the $O_3$ to the TEOS, to deposit a second layer of silicon oxide over the first layer in the recess, wherein the ratio-reducing step is performed for about 30 seconds.

7. A deposition method capable of filling recesses in a substrate, the method comprising:
   (a) providing a substrate having recesses defining side walls and recess bottoms, wherein the recesses are between polysilicon gates and have sidewall portions covered with silicon nitride spacers, and wherein the silicon nitride spacers, the polysilicon gates and the other portions of the substrate, are covered with a silicon nitride liner;
   (b) exposing the substrate to an energized deposition gas comprising a first volumetric flow ratio of $O_3$ and TEOS, to deposit a first layer of silicon oxide in the recess at different rates over the side walls and recess bottoms; and
   (c) reducing the volumetric flow ratio of the $O_3$ to the TEOS, to deposit a second layer of silicon oxide over the first layer in the recess.

8. A method according to claim 7 wherein the silicon nitride liner comprises reentrant cavities, and wherein the reentrant cavities are smoothened by the first layer.

9. A method according to claim 8 comprising depositing the first layer to a thickness of from about 200 to about 800 angstroms.

10. A deposition method capable of filling recesses on a substrate, the recesses being between polysilicon gates and having sidewall portions covered with silicon nitride spacers, and wherein the silicon nitride spacers, the polysilicon gates and the other portions of the substrate, are covered with a silicon nitride liner, the method comprising:
    (a) providing an energized deposition gas comprising $O_3$ and TEOS, to form a first layer of silicon oxide in the recess at different rates over side walls and recess bottoms of the recess; and
    (b) reducing the volumetric flow ratio of $O_3$ to TEOS in the deposition gas, to fill the recesses with silicon oxide after the first layer is formed.

11. A method according to claim 10 wherein the ratio-reducing step is performed by reducing the flow rate of $O_3$.

12. A method according to claim 10 wherein the ratio-reducing step is performed for about 30 seconds.

13. A method according to claim 10 comprising depositing the first layer to a thickness of from about 200 to about 800 angstroms.

14. A method of filling recesses with a dielectric material, the method comprising:
    disposing a substrate defining a recess into a processing chamber; and
    continuously introducing a deposition gas into a processing chamber while gradually changing a relative composition of the deposition gas, such that conformality of the dielectric material within the recess decreases, and deposition rate of the dielectric material within the recess increases, wherein the deposition gas comprises of ozone and tetraethoxysilane (TEOS), and a ratio of ozone:TEOS is decreased over time.

15. The method of claim 14 wherein the ozone:TEOS ratio is decreased by reducing a rate of ozone flowed into the processing chamber.

16. The method of claim 14 wherein the ozone:TEOS ratio is decreased by increasing a rate of TEOS flowed into the processing chamber.

17. The method of claim 14 wherein the ozone:TEOS ratio is changed over a period of about 30 seconds.

18. The method of claim 14 wherein the substrate defines the recess as a shallow trench.

19. The method of claim 14 wherein the substrate defines the recess between raised features.

20. The method of claim 19 wherein the raised features comprise adjacent gate structures.

21. The method of claim 14 wherein the dielectric material is formed over silicon nitride lining the recess.

* * * * *